TRANSISTOR AMPLIFIER TEMPERATURE STABILIZATION CIRCUITS

Filed Aug. 25, 1958 4 Sheets-Sheet 1

INVENTOR.
JOHN W. HIGGINBOTHAM
BY Julian C. Renfro
ATTORNEY

Sept. 24, 1963 J. W. HIGGINBOTHAM 3,105,198

TRANSISTOR AMPLIFIER TEMPERATURE STABILIZATION CIRCUITS

Filed Aug. 25, 1958 4 Sheets-Sheet 2

INVENTOR.
JOHN W. HIGGINBOTHAM
BY Julian C. Renfro
ATTORNEY

INVENTOR.
JOHN W. HIGGINBOTHAM
BY Julian C. Renfro
ATTORNEY

TRANSISTOR AMPLIFIER TEMPERATURE STABILIZATION CIRCUITS

Filed Aug. 25, 1958 4 Sheets-Sheet 4

INVENTOR.
JOHN W. HIGGINBOTHAM
BY Julian C. Renfro
ATTORNEY 3,105,198
TRANSISTOR AMPLIFIER TEMPERATURE STABILIZATION CIRCUITS John W. Higginbotham, Baltimore, Md., assignor to Martin-Marietta Corporation, a corporation of Maryland Filed Aug. 25, 1958, Ser. No. 756,920
2 Claims. (Cl. 330—15)

The present invention relates to the stabilization of transistorized circuits against temperature effects, and more particularly to transistorized circuits wherein an inverse biasing network is employed to provide such stabilization.

Ideally, an amplifying device should operate effectively from full cutoff to full saturation upon progressive increase of its input current. Presently available transistors due to their temperature sensitivity exhibit leakage characteristics which prevent substantially the attainment of an off condition in the transistor output circuit when the input current is zero. However, by introducing non-linearity into the base-to-emitter circuit of such transistor, it may be operated so as to attain substantially the full off condition with zero input current over substantially the entire operating temperature range. Thus, the introduction of non-linearity into the base-to-emitter circuit makes a poor transistor perform as a relatively good transistor.

The invention makes practicable the use of presently available transistors in high gain, direct coupled and complementarily coupled transistorized circuits which operate at high temperatures, such as, for example, regulated power supplies, operational amplifiers, servo amplifiers, switching circuitry, and the like. The successful use of such circuitry requires that the transistors therein shall operate substantially within the linear portion of their operating characteristics. Heretofore, this could be effected only by maintaining the junction ambient temperature of such transistors at relatively low values. At the higher temperatures the operation of such transistors will occur largely, if not wholly, within the non-linear portion of their characteristics. As a result the use of presently available transistors has been limited.

Accordingly it is the primary object of the present invention to provide improved circuit means for stabilizing transistorized circuits including presently available transistors so that operation thereof will occur within the linear portion of their operating characteristics, even at relatively high temperatures.

The circuit means provided in accordance with the invention comprises an inverse biasing network which imparts a substantially predeterminedly controlled non-linearity to the circuit. The biasing network is connected in series circuit relation between the base and emitter electrodes of the transistor. It includes a resistive element R, connected to the base electrode, and a stabistor element S, connected to the emitter electrode. In accordance with the invention, the operation of the inverse biasing network is made extremely sensitive to the selected relative values of the resistor and stabistor elements included therein according to the following criteria defining the network: The value of the resistive element R is preselected to make the term defined by $I_{CL}(RR_1 + Rr_b + R_1r_b)$ substantially equal to or smaller than the term $E_S(R_1+R)$ at a given upper operating temperature for the transistor and the circuit, where:

$I_{CL}$ = the leakage current flowing through the collector electrode of the transistor,
$R_1$ = the resistance of the input circuit of the transistor,
$r_b$ = the resistance of the base electrode of the transistor, and
$E_S$ = the D.C. voltage developed across the emitter to base and the stabistor S.

As is understood by those persons having normal skill in the art, the term "stabistor" wherever employed herein is intended to mean a semiconductor diode especially designed to meet tight tolerance limits in the forward, or conducting, direction with a minimum requirement in the reverse direction.

The effectiveness of the improved circuit derives from the recognition that a transistorized circuit employing available transistors substantially ceases to operate within the linear portion of its characteristic because of proportionate increase of leakage current through its collector electrode with increase of temperature. This leakage current is normally amplified by the transistor circuit. At relatively low temperatures the effect of the leakage current is negligible. However, at relatively high temperatures leakage current "input" to the transistor is so great as to cause the transistor to operate substantially outside its linear characteristic.

The inverse biasing network of the invention serves to introduce a non-linear control of the transistor current which in effect opposes the amplification of the undesired leakage current but which permits amplification of the input signal voltage.

The inverse biasing network of the invention may be employed to stabilize a wide variety of transistorized circuits, against temperature effects, as will be readily understood by those skilled in the art. The present invention, however, further provides a number of especially designed temperature stabilized circuits of a particular advantage. The operation of the inverse bias network and the improved transistor circuitry in which it is employed will be further described in connection with the accompanying drawings in which.

Figure 1:
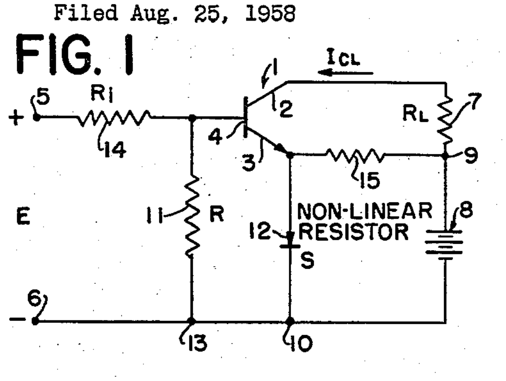
FIG. 1 is a diagram of a transistorized circuit stabilized against temperature effects in accordance with the invention.

The invention may best be described by referring to FIG. 1 in which it is illustrated in the form of a simple transistor amplifier circuit. This circuit includes a transistor, shown generally at 1, having collector electrode 2, an emitter electrode 3, and a base electrode 4. The transistor is provided with an input circuit which is adapted to apply an input signal voltage thereto between the base and emitter electrodes. Accordingly, terminal 5 of the input circuit is connected to the base electrode 4 while terminal 6 is connected to the emitter electrode 3. Further, the transistor is provided with an output circuit including a load impedance 7, denoted as $R_L$, and a D.C. power source 8. The output circuit is connected across the collector and emitter electrodes in order to derive an amplified output signal from the transistor. Accordingly, the load impedance 7 and power source 8 are connected in series, with the load impedance being connected to the collector electrode and the power source having its terminal 9 connected to the load impedance and its terminal 10 connected to the emitter electrode. The stabistor element may be biased by means of a resistor 15. Biasing of the stabistor is seldom necessary since in most applications $I_{CL}$ will provide sufficient biasing action to effect proper degeneration of $I_{CL}$ amplification.

Figure 1A:
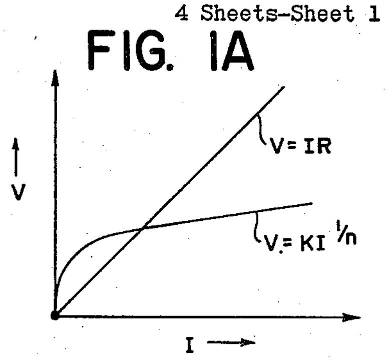
FIG. 1A shows the voltage current relationship of a typical non-linear resistor or stabistor, such as a silicon diode, compared with that of a linear resistor.

The invention resides in the particular circuitry employed in the input means. This circuitry comprises an inverse bias network connected in series between the base and emitter electrodes. The inverse bias circuit includes a resistive element 11, denoted as R, which is connected to the base electrode, and a stabistor element 12, denoted as S, connected to the emitter electrode. In the embodiment of FIG. 1 a diode element is employed as the stabistor element of the inverse bias circuit. This stabistor or diode exhibits an extremely non-linear impedance characteristic, its impedance being very high at low currents but decreasing logarithmically with increasing current to relatively low values as shown by the voltage current relationship plotted in FIG. 1A. The dynamic change in resistance value (curve slope) is in the order of magnitude of ten thousand to one. The common connecting point 13 of the resistor and stabistor elements is connected in common to terminal 10 of the D.C. power source and to the input terminal 6. The input circuit is completed by a resistance 14, denoted as $R_i$, which may be considered to be the series resistance of the input circuit means.

It is the purpose of this inverse bias circuit to stabilize the transistor amplifier circuit against temperature effects. As illustrated in the diagram of FIG. 1 there is present in every transistor circuit a certain amount of leakage current $I_{CL}$ emanating from the battery source of the collector electrode. This leakage current is converted into a voltage at the input circuit and is therefore amplified by the transistor circuit. At lower temperatures the value of this leakage current is small, and the effect of its amplification upon the operation of the transistor circuit, negligible. However, the value of the leakage current increases logarithmically with temperature so that at high temperatures the input voltage to the transistor derived from the leakage current may become so great as to drive the transistor out of the linear portion of its operating characteristic. In fact, in some instances the amplification of the leakage current becomes so great as to destroy the transistor. The inverse bias network provided by the invention prevents the amplification of leakage current while permitting amplification of the input voltages thus stabilizing the transistor circuit against the temperature effects above described.

The operation of the inverse bias voltage in effecting this temperature stabilizaiton may be explained as follows: The unwanted leakage current $I_{CL}$ emanating from the battery source flows through the collector electrode and the resistive element R. The resistive element thus transforms the leakage current into a predictable base voltage, which voltage varies with the temperature of operation. With the resistive element alone in the input circuit the base voltage thus created would act as an input voltage and be amplified by the transistor. To prevent this creation of an input voltage across the base and emitter electrodes of the transistor and the consequent amplification resulting therefrom, the invention provides the stabistor element S. The leakage current then also flows through the stabistor element causing a second voltage which varies with the temperature. This voltage opposes the voltage created across resistive element R thereby canceling out the effect of that voltage so that the base-to-emitter electrodes of the transistor remain at zero voltage or at a slightly reverse polarity so that no leakage current amplification is possible.

It may thus be seen that the invention has been derived from the recognition that the effects of temperature on a transistor circuit are traceable to the temperature-sensitive leakage current $I_{CL}$. The explanation given above, however, is an oversimplified one intended to provide the reader with an intuitive grasp of the manner in which the inverse bias network operates. Actually, the inverse bias network is so sensitive to the values selected for the resistive and stabistor elements of the circuit that a more rigid analysis is required. Otherwise, without the proper selection of values as provided by the invention, the circuit becomes unworkable to the extent that the desired function is not at all effected.

Figure 2:
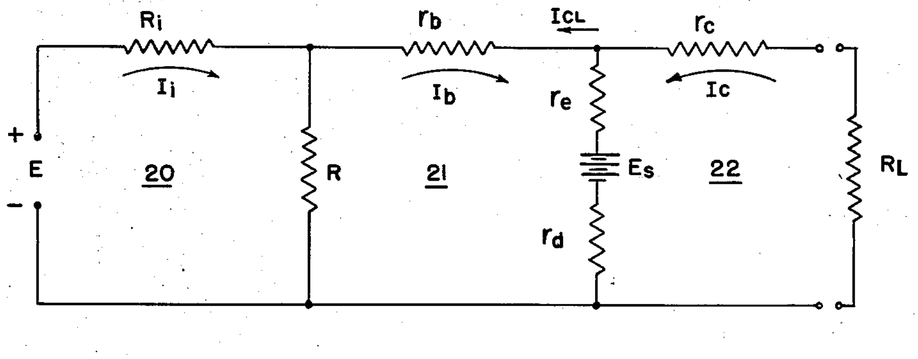
FIG. 2 is an equivalent circuit diagram of the circuit of FIG. 1 for purposes of analysis.

The more rigid analysis of the inverse bias network requires reference to an equivalent diagram of the transistor circuit, illustrated in FIG. 2. The first current loop 20 includes the input voltage E, the input resistance $R_i$, and the biasing resistance R, through which flows the input current $I_i$. The second current loop 21 includes, in addition to the biasing resistance R, the base resistance $r_b$, the emitter resistance $r_e$, the voltage $E_S$ developed across the stabistor element, and the dynamic resistance $r_d$ of the diode stabistor, through which flows the base current $I_b$. The third current loop 22 includes, in addition to the emitter resistance $r_e$, the voltage $E_S$, the dynamic diode resistance $r_d$, the collector resistance $r_c$, and the load impedance $R_L$ through which flows the collector current $I_c$.

These current loops may be solved by the application of Kirchhoff's law as follows:

(1) $$I_c = BI_b + I_{CL}$$

where $B$ = the common emitter transistor current gain.

From Equation 1 it can be seen that:

$$I_b = \frac{I_C - I_{CL}}{B}$$

Then for purposes of simplification and substitution in the following computations, assume that:

(1A) $$I_C' = I_C - I_{CL}$$

(2) $$E = I_i(R_i + R) - R\frac{I_c'}{B}$$

(3) $$-E_S = \frac{I_c'}{B}(R + r_b + r_e + r_d) - I_iR + I_c'(r_e + r_d) - I_{CL}\left(r_b + \frac{RR_i}{R + R_i}\right)$$

(4) $$I_c = \frac{B[ER + I_{CL}(RR_i + R_ir_b + Rr_b) - E_S(R_i + R)]}{RR_i + (r_e + r_b + r_d)(R_i + R) + B(r_e + r_d)(R_i + R)} + I_{CL}$$

Assuming that $R_i$ is large or that the circuit is driven from a current source, Equation 4 may be simplified to read:

$$(5) \qquad I_e=\frac{B[I_iR+I_{CL}(R+r_b)-E_S]}{R+(r_e+r_b+r_d)+B(r_e+r_d)}+I_{CL}$$

An inspection of Equation 4 reveals that the addition of the stabistor element in the emitter leg gives a term that permits the prevention of amplification of the leakage current through the collector electrode. This may be explined by noting that as long as the numerator of the fraction in Equation 4 remains zero or negative there will be no output of the transistor circuit, other than the unamplified leakage current $I_{CL}$, so that the amplifier circuit will be essentially at cutoff. To put it another way, it can be seen from the numerator of Equation 4 that as long as the drift current factor, $I_{CL}(RR_i+R_ir_b+Rr_b)$, is equal to or smaller than the feedback factor, $E_s(R_i+R)$, the output current for the stage will be the unamplified drift current $I_{CL}$. The output current will have an amplified relationship to any input voltage E that is introduced but the aforementioned drift current and feedback factors will remain the same relative to one another. Thus the transistor may be made to operate over the linear portion of its range by choosing the value of R so that the term $I_{CL}(RR_i+R_ir_b+Rr_b)$ is substantially equal to or smaller than the term $E_S(R_i+R)$ at the preselected upper operating temperature for the transistor (that is, the highest expected value of $I_{CL}$).

In order to prevent shunting the input current away from the base electrode, the value for the voltage $E_S$ across the stabistor element may have to be selected so that the value of R is much larger than the transistor input impedance. If the drift component of the leakage current $I_{CL}$ is troublesome it may be minimized by making either $E_S$, R, or both, temperature sensitive so that they track with $I_{CL}$ thereby keeping the term $$I_{CL}(RR_i+R_ir_b+Rr_b)$$

substantially equal to $E_S(R_i+R)$ for all temperatures.

It will be noted that Equation 4 reduces to Equation 5 when the transistor circuit is driven from a current source, such as a preceding transistor stage, rather than a voltage source. This is due to the fact that the value of $R_i$ may be assumed to be large under those circumstances. In most multiple stage circuits, therefore, Equation 5 may be used for all stages except the first or input stage which will in most cases be a voltage input stage.

The prime advantage of the use of the inverse bias network of the invention is that it provides complete control of leakage currents in direct-coupled amplifiers thereby increasing the usable temperature range in addition to providing greatly improved performance and reliability. For example, heretofore in high gain, high current D.C. circuitry only specially selected transistors having low leakage current characteristics have been able to be employed. This resulted in the rejection of approximately 40 percent of manufactured transistors. With the use of the inverse bias network of the present invention, however, 100 percent utilization of transistors has been enabled regardless of their leakage current characteristics. In addition, it has been found that this invention enables operation at a amixmum junction temperature in the vicinity of 85° C. which is equally as good as the normal operation experienced at room temperatures.

In one particular test a voltage regulator circuit was designed which included the inverse biasing networks of the invention. The use of this bias stabilization enabled the use of transistors so leaky as to be useless in previous such circuits. Not only did these transistors operate at higher temperatures but they did so at over twice the dynamic impedance as did the best transistors employed in conventional circuits.

The inverse bias network of this invention may be employed to stabilize a wide variety of transistor circuits against temperature effects. Further included as a part of this invention are a number of espeically designed circuits, all of which are developed from the principle of the previously described non-linear stabilized transistor stage. Since these stages retain a complete dynamic range from cutoff to saturation without reversal of input current, they may be cascaded as shown in the following typical circuit applications and simple feedback employed to stabilize for any degree of drift characteristic.

Figure 3:
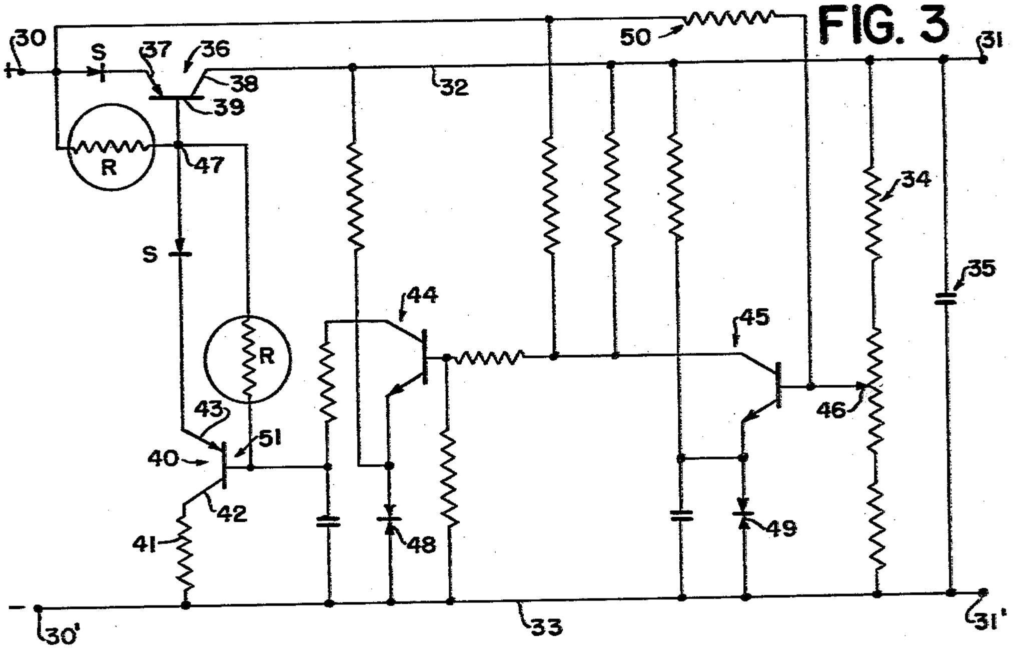
FIG. 3 is a circuit diagram of a voltage regulator circuit stabilized against temperature effects in accordance with the invention.

The first of these circuits is illustrated in FIG. 3 wherein is shown a voltage regulator circuit for a D.C. power supply. The function of such a circuit is to monitor the unregulated output of a D.C. power supply and maintain it constant with variations in A.C. supply voltage, or variations in load impedance, or both. It is therefore important that such a regulator circuit does not itself provide fluctuations in voltage. For this reason transistors have heretofore been unsuitable for utilization in very high gain voltage regulator circuits due to their temperature instability. The circuit of FIG. 3, however, employs the inverse bias network of this invention in such a manner as to effect temperature stabilization within a transistorized voltage regulator circuit to such an extent as to permit the circuit to compete favorably over temperature ranges and load ranges superior to previous stabilized linear transistorized regulators, and providing voltage ranges not available by the use of vacuum tubes.

The circuit comprises a D.C. power supply having input and output ends as indicated by terminals 30, 30′ and 31, 31′ connected by a pair of conductive lines 32 and 33. A voltage divider network, shown generally at 34, is connected across these lines and a capacitor 35 is shunted thereacross. The D.C. voltage output of the power supply appears across the divider network 34 and is developed by the flow of current introduced into the conductive lines and flowing through the network 34. To regulate the voltage developed across the divider network a transistor 36 is connected in series in conductive line 32 through its emitter-collector electrode path with the emitter electrode 37 connected to the input end of the line and the collector electrode 38 connected to the output end of the line. Transistor 36 is also connected at the input end of the conductive lines relative to the divider network 34. Thus the value of the current flowing through the divider network may be regulated by controlling the bias voltage applied to transistor 36 thereby to control the output voltage of the power supply.

It may therefore be seen that if some way is provided for regulating the bias of transistor 36 in proportion to any deviations from a constant D.C. output voltage and in such a direction as to vary the current flow to compensate for such voltage deviations, the output of the D.C. power supply may be maintained at a constant regulated value. In the circuit of FIG. 3 such regulation is provided by a second transistor 40 which is connected between the base electrode 39 of transistor 36 and the conductive line 33 through its emitter-collector electrode path and a protective resistor 41 connected to the collector electrode 42. As shown in the figure the emitter electrode 43 is connected to the base electrode 39 of transistor 36 while the collector electrode 42 is connected to conductive line 33 through its protective resistor 41.

Disregarding for the moment transistors 44 and 45 it can be seen that the base electrode 51 of transistor 40 is connected to a preselected point 46 on the voltage divider network 34 which establishes a bias voltage for the transistor. Advantageously the point of connection to the voltage divider network is made adjustable so that an appropriate bias voltage may be selected. This preselected point on the voltage divider network must vary with the voltage fluctuation across the output terminals of the power supply since the voltage divider network is connected thereacross. Thus the bias applied to the transistor 40 fluctuates in proportion to the fluctuations in output voltage. As a result, the current output of transistor 40 also fluctuates in such proportion. This, in turn, proportionally fluctuates the voltage at point 47. Since point 47 is connected to the base electrode 39 of transistor 36 the bias voltage applied thereto will also vary in proportion to the voltage fluctuations at the output of the D.C. power supply. In this way the value of current flowing through the conductive lines 32 and 33 is regulated to compensate for these voltage fluctuations thus maintaining the D.C. output across the voltage divider network substantially constant. Due to the unavoidable delay between the sensing of a voltage variation at point 46 and the compensation provided by transistor 36 some voltage fluctuation will appear across the regulated output of the power supply. These fluctuations are, however, so small and of such frequency that they may be effectively filtered out by the ue of capacitor 35.

To stabilize this circuit against undesirable temperature effects inverse bias networks are provided for both transistors 36 and 40. This is due to the fact that the regulator circuit is extremely sensitive to any operating deviations in these two transistors. As shown in FIG. 3 a separate one of the inverse biasing networks is connected in series between the base and emitter electrodes of each of the transistors 36 and 40, respectively. Each of the biasing networks includes a resistive element R connected to the base electrode and a stabistor element S connected to the emitter electrode. Further, in accordance with the invention, the value of each resistive element R is selected to make the term $$I_{CL}(RR_1+R_1r_b+Rr_b)$$

substantially equal to or smaller than the term $$E_S(R_1+R)$$

at a preselected upper operating temperature for each transistor where the terms of the equation are as hereinbefore described.

It will be noted that the application of a biasing voltage from the voltage divider network to the transistor 40 is effected through an amplifier network comprising transistor amplifier circuits 44 and 45. Such circuits may advantageously be employed where amplification of the voltage from the voltage divider network is required in order to effectively bias the transistor 40. When employing amplifiers in this circuit, it is extremely important to maintain the bias voltage of each transistor amplifier tied to a constant reference potential. This may be advantageously effected in miniaturized form by the use of Zener voltage diodes 48 and 49. Further regulation of the output voltage of the regulator circuit may advantageously be effected by the use of a feedback network, shown generally at 50, connecting the voltage pickup point 46 at the voltage divider network to the input of the regulator circuit.

Figure 4:
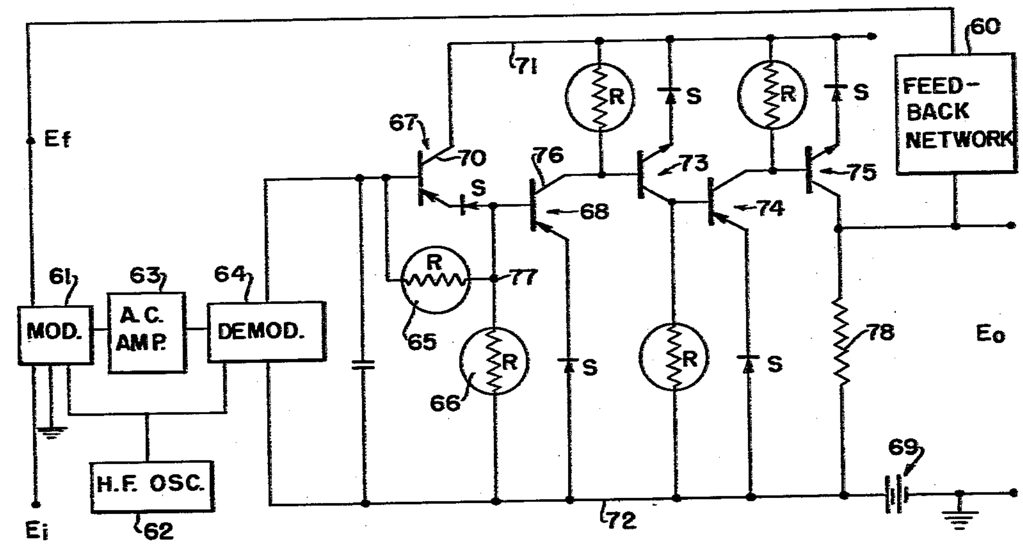
FIG. 4 is a circuit diagram of an operational amplifier circuit stabilized against temperature effects in accordance with the invention.

Another specially designed circuit which forms a part of this invention is shown in FIG. 4 wherein is illustrated an operational-type amplifier having a temperature stabilized D.C. output amplifier section. Such a circuit is often used in analog computer circuitry and the like wherein extremely accurate output D.C. voltages are required. For this reason transistor elements have found little use in the D.C. sections of such circuit in the past due to their instability with variations in temperature. As a result the more stable vacuum elements have had to be employed precluding many miniaturized applications. The transistorized circuit of FIG. 4, however, employing the temperature stabilization technique of the invention, achieves stability equal to that of vacuum tube elements thereby opening up new fields of utilization for the operational amplifier.

In the operational amplifier of FIG. 4 the output voltage $E_0$ is reapplied to the input through a feedback network 60 and compared with an externally applied input voltage $E_1$. Advantageously, this comparison and the first stages of amplification are effected through the use of A.C. techniques. This is due to the fact that transistors, like vacuum tubes, do not lend themselves to driftless D.C. amplification. The drift parameters introduced thereby would appear as errors in the signal output. The A.C. techniques employed include the use of a signal modulation envelope. This modulation causes the cancellation of any D.C. component due to drift because A.C. amplification may be employed. Thus in the circuit of FIG. 4 the feedback signal $E_f$ and the input signal $E_1$ are applied to a modulator 61, driven by a high-frequency oscillator 62, which produces an A.C. output voltage that is representative of the difference between the two D.C. input signals. This output signal is amplified to a preselected A.C. value by means of an A.C. amplifier 63. The output of the A.C. amplifier 63 is then applied to a demodulator 64 which converts the A.C. signal to a proportional D.C. output voltage.

The D.C. output of the demodulator is applied to a D.C. output amplifier as normally required in operational-type amplifiers. This D.C. output amplifier employs the temperature stabilization techniques of the invention as indicated above. The circuit includes a voltage divider network connected across the output of the demodulator 64. This voltage divider network comprises a pair of resistive elements 65 and 66, which are employed to bias two input transistors 67 and 68, across their respective emitter and base electrodes. The transistors are connected with their respective base-emitter electrode paths in series relationship. The biasing of the transistors is then effected by connecting resistive element 65 between the base and emitter electrodes of transistor 67 and the resistive element 66 between the base and emitter electrodes of transistor 68.

It will be noted that one end of the voltage divider network is connected to a preselected reference voltage in the form of a D.C. power supply 69. Thus only the other end of the voltage divider network is permitted to vary in accordance with the output of the demodulator circuit. This end is connected to transistor 67. The voltage output of transistor 67 is then derived from its collector electrode 70 and employed as a second reference potential for the remaining stages of the D.C. amplifier. Having thus established two reference potentials along conductive lines 71 and 72, the remaining transistor stages are connected to the conductive lines in a staggered cascade arrangement. In this way each transistor of successive stages is referred to a different one of the reference lines. Thus, for example, the emitter electrode of transistor 73 is connected to line 71, while that of transistor 74 is connected to line 72, and that of transistor 75 is connected back to line 71.

The input to these staggered transistors is then derived from the collector electrode 76 of transistor 68. Transistor 68 is biased by being connected to point 77 on the voltage divider network between the resistive elements 65 and 66. Therefore the input voltage to the staggered transistors is proportional to the output voltage of the demodulator 64. The output voltage of transistor 68 is then amplified by the remaining stages which, because of their staggered arrangement, aid the overall stability of the circuit.

In order to provide the temperature stability required for a circuit of this type the inverse bias network of the invention is then applied to the transistor elements within the D.C. amplifier circuit. These inverse bias networks comprise the stabistor element S and resistive element R connected as hereinbefore described. However, the circuit is so designed that the resistive elements may be employed to serve in a dual capacity in each instance. Thus, for example, the resistive elements 65 and 66 associated with the input transistors 67 and 68 are also utilized in the input voltage divider network. Further, the remaining resistive elements associated with the staggered transistors 73, 74, and 75 of the circuit double as load impedances for the preceding transistor stage in each instance. In completing the circuit the output load impedance 78 of the final transistor 75 is advantageously referenced to the D.C. power supply to produce the output voltage $E_0$.

Another especially designed circuit provided by the invention is one which is adapted for use as a servo amplifier. A servo amplifier is required to effect an amplification which must remain an accurate representation of an input voltage under all conditions. Such amplifiers find great use in military applications where miniaturization is an important problem. Heretofore, because of the temperature instability of transistor elements, vacuum tube elements have normally had to be employed making miniaturization difficult if not impossible. Again the present invention provides the means for employing transistor elements in such applications thereby extending the potential uses of servo amplifier circuits.

Figure 5:
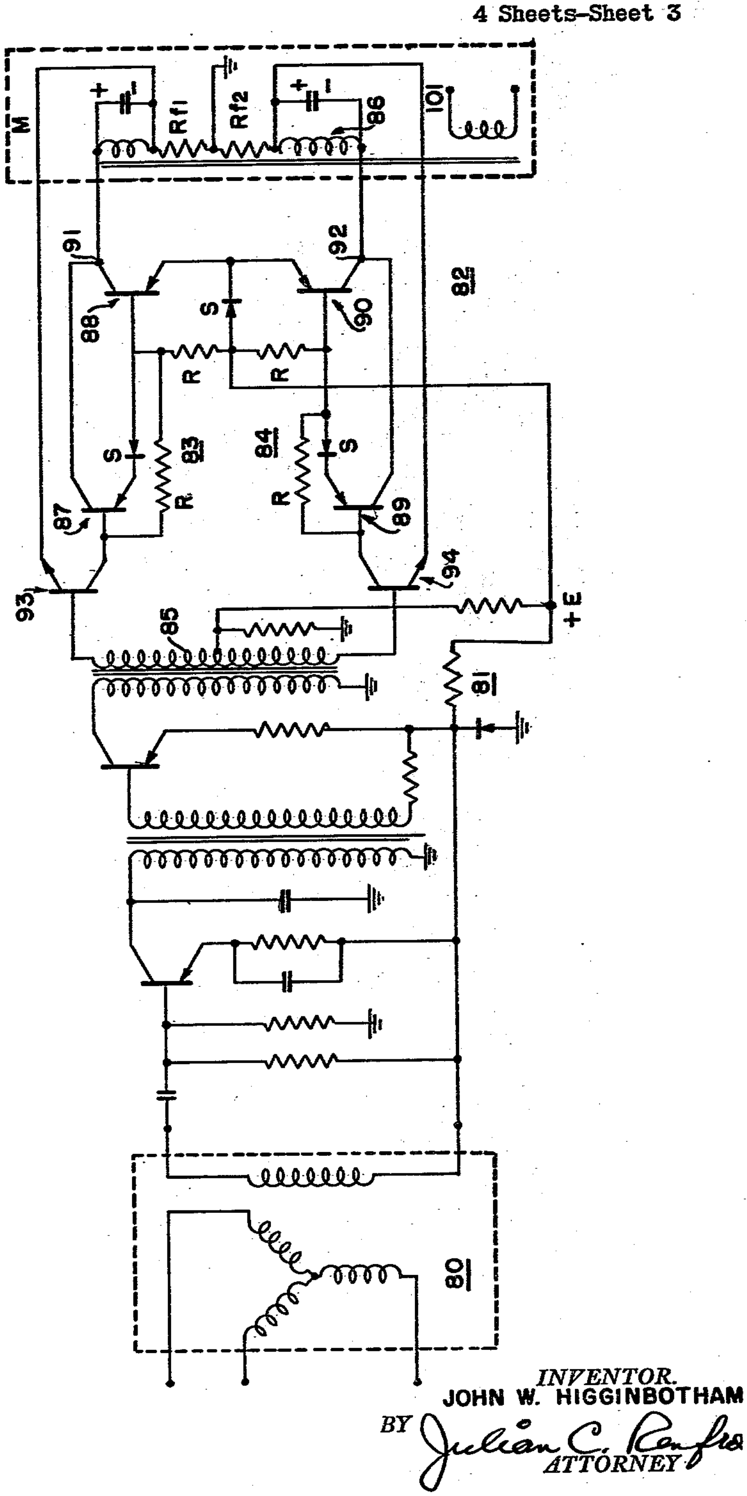
FIG. 5 is a circuit diagram of a servo amplifier circuit stabilized against temperature effects in accordance with the invention.

As shown in FIG. 5 the input voltage to the servo amplifier is taken from a first signal-producing servo motor 80, such as a synchro. The A.C. output signal from servo motor 80 is then applied through conventional amplifier circuitry 81 to the final output stage 82 of the servo amplifier. This stage is advantageously of the push-pull type in order to provide greater stability. The output of stage 82 is then applied to the servo motor of the system 101. The improvement of FIG. 5 resides in the design of the push-pull circuit so that the inverse biasing networks may be most advantageously employed in providing the temperature stability required.

The push-pull circuit 82 is divided into two identical amplifiers 83 and 84 both referenced to the center tap of an input transformer 85 and the center tap of an output transformer 86. Amplifier 83 includes transistors 87 and 88, while amplifier 84 includes transistors 89 and 90. In each amplifier the transistors are connected with their base-emitter electrode paths in series and with their collector electrodes connected to a common output point, 91 in the case of amplifier 83 and 92 in the case of amplifier 84. The output network of the push-pull circuit is then connected across these two points while the base electrodes of transistors 87 and 89 are connected to the collector electrodes of transistors 93 and 94 which are in turn push-pull driven by transformer 85.

The operation of this servo amplifier output stage is similar to the preceding non-linearized direct-coupled amplifiers described herein except that it is a double ended amplifier employing feedback bias stabilization to correct for drift of the two non-linear stages 83 and 84. These non-linear stages retain their complete dynamic range with one direction of current input controlling them from cutoff to saturation. Remaining drift is reduced by three stage feedback developed by $R_{f1}$ and $R_{f2}$ and fed to the emitters of the input transistors 93 and 94 respectively. In addition to effecting bias stabilization this negative feedback reduces crossover distortion for class B operation and provides improved gain stability. If this circuit is to be applied to a wide band-pass audio amplifier, the transformer 85 could be replaced by a transistor phase inverter.

Finally, the invention provides a miniaturized regenerative switching circuit which has the advantages of high sensitivity, no moving parts, and extremely fast operation. Advantageously, switching circuits may be designed to be operable by even extremely small voltage quantities by the use of regenerative feedback within the system. Such circuits are very sensitive to even the slightest triggering input signal and then by regeneration produce an output signal of usable magnitude. Because of this sensitivity a regenerative switching circuit must be extremely stable in order not to trigger itself into operation. Therefore, miniaturization by the use of transistors has been unvailable to such circuits due to the temperature instability of such elements. The inverse bias network of the invention, however, provides the means for permitting such transistorized miniaturization. An example of this stabilization technique is illustrated in the switching circuit of FIG. 6 wherein the improved design provides further advantage in that the biasing network effects regeneration as well.

Figure 6:
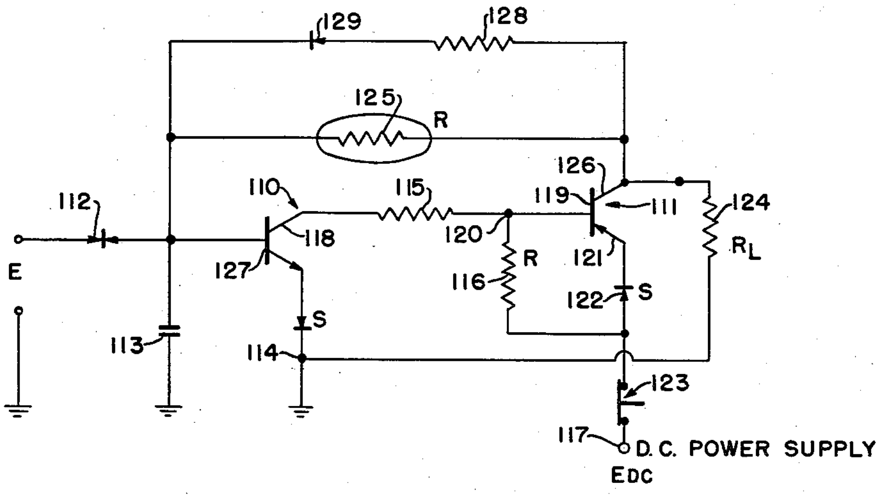
FIG. 6 is a circuit diagram of a regenerative switching circuit stabilized against temperature effects in accordance with the invention.

The switching circuit of FIG. 6 employs a pair of complementary transistor types. Complementary transistors are defined as a pair of transistors one of which is of the N-P-N type and the other of which is of the P-N-P type. Either complementary type may be employed as the first stage of the switching circuit as long as the other type is used as the second stage. In FIG. 6 the first transistor stage 110 is of the N-P-N type while the second transistor stage 111 is of the P-N-P type as shown by the direction of the arow in the emitter electrode. Transistor 110 is provided with an input circuit means, including a Zener diode 112 and a capacitor 113, connected across the base and emitter electrodes. A stabistor element, diode 114, is also connected to the emitter electrode as provided by the invention. The output circuit means for transistor 110 comprises two load resistors 115 and 116 and a D.C. power supply 117 connected in series to the collector electrode 118. The output signal from transistor 110 is therefore developed across these load resistors.

The transistor 111 also has its input circuit means connected across its emitter and base electrodes. This is effected by connecting the base electrode 119 to the common point 120 of the two load resistors and resistor 116 to the emitter electrode 121. In this way transistor 111 is made responsive to the output signal from transistor 110 as developed across load resistor 116. Emitter electrode 121 is connected through a stabistor element, diode 122, to the resistor 116 and the two in common are connected to the D.C. power supply 117. A reset button 123 is also provided to disconnect the power supply 117 from the circuit when desired. The output circuit for transistor 111 comprises a load resistor 124 which is connected at one end to the collector electrode 126 and at the other end to the stabistor element 114. To complete the circuit a resistive element 125 is connected from the load resistor 124 to the input circuit of transistor 110 at its base electrode 127. This resistor thereby couples the output voltage of transistor 111 back to the input circuit of transistor 110.

It will be noted that the load resistor 124 of the transistor 111 and the resistor 125 form a resistive path which in series with the stabistor element 114 connects the emitter and base electrodes of transistor 110. Thus resistors 124 and 125 form a resistive element R which operates in conjunction with the stabistor element 114 to form an inverse bias network as specified by the invention. Further, it will be noted that the load resistance 116 of transistor 110 is connected as a resistive element R to form in combination with the stabistor element 122 an inverse biasing network for transistor 119 as specified by the invention.

The operation of the switching circuit is as follows: Initially, without the application of a voltage E to the input of the circuit, a voltage drop is developed across the two stabistor elements 114 and 122 as a result of current flow from the D.C. power supply 117. The values of the circuit elements should be selected so that the voltage thus developed across the stabistor elements is sufficient to hold the transistor elements at cutoff thereby preventing any triggering of the circuit into operation. It is at this point that the temperature stabilization provided by the inverse biasing networks of the invention operates to prevent premature triggering of the circuit into operation. This can be explained by noting that the cutoff voltage could be overcome by a voltage developed at the input of the transistors due to a temperature inspired leakage current $I_{CL}$. The inverse biasing network, however, prevents such premature triggering by counteracting the voltage-producing effects of the leakage current as hereinbefore described. To effect such counteraction the values of the elements of the inverse biasing networks must, of course, be selected in accordance with the equations above established. Further, the capacitor at the input circuit of the first transistor is provided to prevent transient surges from prematurely turning the circuit on. To further insure stabilization the resistive element 125 may advantageously be a thermistor in order to partially track the temperature change of the leakage current.

This non-linear condition will remain thus quiescent until an external voltage E is applied at the input of the circuit. The voltage E causes current to flow through the resistor 125 and the load resistor 124 causing a voltage drop thereacross. When the value of this voltage drop exceeds the value of the cutoff voltage across stabistor element 114 plus the voltage necessary to overcome the non-linearity of base electrode 127, a base current will flow through transistor 110. This base current causes a larger output current to flow from the collector electrode 118 through its load resistances 115 and 116. When this output current becomes large enough to cause a voltage drop across load resistor 116 in excess of the value of the cutoff voltage across stabistor element 122, plus the voltage necessary to overcome the non-linearity of base electrode 119, a base current will flow through transistor 111. This base current will then be amplified causing a larger output current to flow from the collector electrode 126 through its load resistor 124. Thus the original voltage drop across resistor 124 causing a base current to flow in transistor 110 is increased. A larger base current is then applied to transistor 110 through resistor 125 causing even further amplification in the circuit. This regenerative action will continue until the circuit saturates. Resetting the switching circuit may be accomplished by disconnecting the D.C. voltage source by the use of the reset switch 123.

It will thus be seen that the resistive elements 116, 124, and 125 not only function in the inverse bias networks required in order to permit sensitive regeneration to be employed, but that they function to produce the regenerative action as well.

Figure 7:
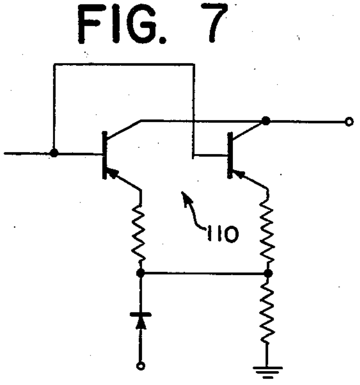
FIG. 7 is a diagram of a parallel transistor arrangement which may be employed in the circuit of FIG. 6.

Another advantage of the switching circuit of the invention is that it is capable of switching high voltage and current quantities. Thus if an output current of $E_{DC}/R_L$ can be provided by the amplifier circuit, where:

$R_L$=the value of load resistor 124, and
$E_{DC}$=the voltage output of power supply 117, the full value of the power supply may be delivered to the output load. This requires only that the value of resistor 125 be made small enough to permit a base current to flow in transistor 110 large enough to produce an output current of $E_{DC}/R_L$. If it is desired to provide even higher output currents either the first stage, the second stage, or both, may be formed of two transistors connected in parallel as illustrated in FIG. 7.

It should be noted, however, that in the case of high current loads the value of resistor 125 necessary to provide current saturation may be so low as to require excessive current to provide the voltage drop initially necessary to turn on the circuit as hereinbefore described. If this condition is found to exist, the resistor 125 may be deprived of its feedback function and employed only to turn on the circuit. Feedback is then effected by a series network of a resistor of low value 128 and a diode 129 connected in parallel across the resistor 125. The diode 129 should be polarized so that the initiating current does not flow through the feedback network but does flow through the larger value resistance 125 thus turning on the circuit with little current. The feedback function is then effected by the lower value resistance 128 due to the polarization of diode 129 permitting current flow in the feedback direction, the much lower resistive value of the feedback network acting as a bypass of resistor 125.

In addition to the above-recited advantages of the switching circuit of FIG. 6 a further advantage is found in that no limit exists with respect to the number of parallel and series transistors which may be employed in the circuit. This is due to the fact that the inverse biasing networks overcome the build-up of leakage current due to the amplification regardless of the number of transistors employed.

Figure 8:
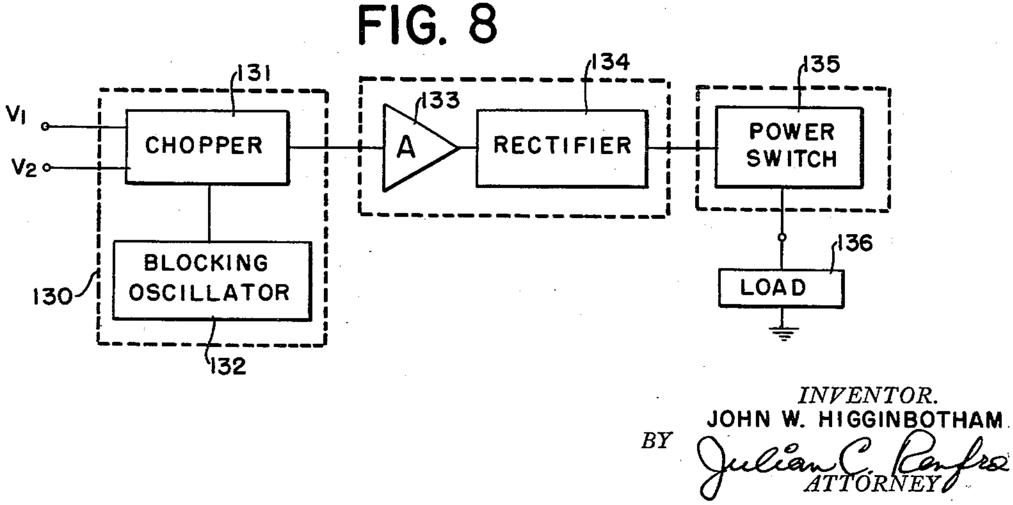
FIG. 8 is a block diagram of a voltage comparator circuit employing the switching circuit of FIG. 6.

The switching circuit of the invention may advantageously be employed in a D.C. voltage comparator. Such a circuit is illustrated in block diagram form in FIG. 8. The comparison and any required amplification are preferably effected through the use of A.C. techniques. This is due to the fact that transistors, like vacuum tubes, do not lend themselves to driftless D.C. amplification as hereinbefore noted. Thus, the D.C. voltages to be compared, $V_1$ and $V_2$, are first applied to a modulator 130 in the form of a chopper 131 driven by an oscillator 132. The modulator produces an A.C. output signal which is representative of the difference between the two input signals. Prior to the transistor, electromagnetic choppers were employed to convert D.C. signals to A.C. signals. These devices restricted the carrier frequency of the A.C. output to a few kilocycles thereby restricting the amplifier bandwidth and response speed. Transistor circuits, however, provide a solution to this problem. For example, a square loop core transistor oscillator can be made to operate as blocking oscillator 132 at frequencies well up to 20 kilocycle square waves. The output from such an oscillator applied to the chopper 131 provides a modulator which will operate at the oscillator output frequency. Thus the output of the chopper is an A.C. voltage running at a relatively high frequency.

This output is applied to an A.C. amplifier 133 which because of its A.C. characteristics is relatively driftless. The output of the amplifier is then applied to a rectifier 134 which converts the A.C. signal back to a proportional D.C. output voltage. Rectification is employed rather than modulation in this particular case since the comparator is connected only with the magnitude of errors and not their polarity.

The combination of modulator, A.C. amplifier, and rectifier as described provide an excellent driftless D.C. amplifier. Since the carrier frequency is high, excellent bandwidth is obtained, and because the A.C. amplifier is made to pass square waves, the filtering required is almost negligible.

Finally, the D.C. output of rectifier 134 is applied to the switching circuit of FIG. 6, shown as block 135. It is the function of the switch to trigger when the difference in value of the voltages $V_1$ and $V_2$ exceeds a certain preselected maximum and to drive an output load 136 when thus triggered. This may be done by setting the threshold level required to overcome the initial cutoff condition of the switching circuit at the value of the D.C. output voltage produced by the rectifier 134 when the output of the chopper 131 is the specified maximum difference. Because of its regenerative action the switch is very sensitive to minute variations above the threshold value and, at the same time, capable of producing a large output voltage to operate the load 136. A Zener diode, 112 in FIG. 6, is advantageously used between the rectifier output and the switch to minimize the drift of the threshold level of the circuit once it has been set.

A tested comparator circuit in accordance with the invention was designed to monitor two D.C. voltages continuously. This circuit was able to be triggered by a difference between the input voltages $V_1$ and $V_2$ of 100 microvolts for as little a time duration as 300 microseconds and to further deliver up to 2 amperes of current to a load. As hereinbefore described the output current can be increased by the parallel operation of transistors and the addition of more stages in the switching circuit.

Preferred embodiments of the invention have been described. Various changes and modifications may be made without departing from the scope of the invention as defined in the claims.

I claim:

1. A servo amplifier circuit stabilized against temperature effects comprising (a) an input transformer having a center-tapped secondary with the center tap thereof resistively connected to ground, (b) first and second preamplifier transistors of a first conductivity type having the base electrodes thereof directly coupled to respective ends of the secondary of said input transformer, (c) first and second amplifier transistors of a second conductivity type opposite said first conductivity type and having the base electrodes thereof directly coupled to respective collector electrodes of said preamplifier transistors, (d) first and second circuit points, (e) first and second resistive elements R connected (1) on one side to the base electrodes of said first and second amplifier transistors respectively and (2) on the other side to said first and second circuit points respectively, (f) first and second stabistor elements S connected (1) on one side to the emitter electrodes of said first and second amplifier transistors respectively and (2) on the other side to said first and second circuit points respectively, (g) third and fourth amplifier transistors of the second conductivity type and having the base electrodes thereof directly coupled to said first and second circuit points respectively, (h) a third circuit point, (i) third and fourth resistive elements R (1) connected on one side to said first and second circuit points respectively and (2) commonly connected to said third circuit point on the other side, (j) a third stabistor element S (1) connected to said third circuit point on one side and (2) commonly connected to the emitter electrodes of said third and fourth amplifier transistors, (k) push-pull output circuit means coupled on one side to the collector electrodes of said first and third amplifier tarnsistors and on the other side to the collector electrodes of said second and fourth amplifier transistors for receiving driving power therefrom, (l) a pair of current feedback connections coupled for completing the respective emitter electrodes of said first and second preamplifier transistors and for providing negative current feedback from said output circuit means, (m) the value of said resistive elements R being preselected to maintain the term defined by $$I_{CL}(RR_i+R_iR_b+Rr_b)$$

substantially equal to or smaller than the term $E_s(R_i+R)$ at a given upper operating temperature for the said transistor associated therewith, where:

$I_{CL}$=the collector leakage current of said transistor, $R_i$=the resistance of the input circuit of the associated said transistor, $r_b$=the base resistance of the associated said transistor, and $E_s$=the D.C. voltage developed across the associated said stabistor element S, (n) D.C. power source means connected for supplying power to said transistors.

2. A servo amplifier in accordance with claim 1 wherein (a) said push-pull output circuit means comprises an output transformer having (1) a first primary winding commonly connected on one end to the collector electrodes of said first and third amplifier transistors and (2) a second primary winding commonly connected on one end to the collector electrodes of said second and fourth amplifier transistors, and (b) said pair of feedback connections includes current feedback resistors $R_{f1}$ and $R_{f2}$ (1) connected on one side to the other ends of said first and second output primary windings respectively, (2) commonly connected to ground on the other sides, and (3) directly coupled from the ungrounded sides thereof to the collector electrodes of said first and second preamplifier transistors respectively.

References Cited in the file of this patent

UNITED STATES PATENTS

| | | |
|---|---|---|
| 2,594,449 | Kircher | Apr. 29, 1952 |
| 2,660,624 | Bergson | Nov. 24, 1953 |
| 2,698,416 | Sherr | Dec. 28, 1954 |
| 2,730,576 | Caruthers | Jan. 10, 1956 |
| 2,829,281 | Van Overbeek | Apr. 1, 1958 |
| 2,832,035 | Bruck et al. | Apr. 22, 1958 |
| 2,860,193 | Lindsay | Nov. 11, 1958 |
| 2,892,165 | Lindsay | June 23, 1959 |
| 2,920,278 | Prugh | Jan. 5, 1960 |

FOREIGN PATENTS

| | | |
|---|---|---|
| 531,967 | Belgium | Oct. 15, 1954 |

OTHER REFERENCES

Sylvan: "Reducing Standby Current With Silicon Diodes," Electronic Design, July 23, 1958, pages 36, 37.

Shea: "Principles of Transistor Circuits, 1953, pages 349–351.